United States Patent [19]
Chudleigh, Jr.

[11] 3,944,942
[45] Mar. 16, 1976

[54] AUTOMATIC GAIN CONTROL CIRCUIT AND METHOD

[75] Inventor: Walter H. Chudleigh, Jr., Paoli, Pa.

[73] Assignee: Control Data Corporation, Minneapolis, Minn.

[22] Filed: June 26, 1972

[21] Appl. No.: 278,479

[52] U.S. Cl. .............. 330/86; 328/151; 328/168; 330/29
[51] Int. Cl.² .................. H03G 3/30; G01V 1/28
[58] Field of Search ......... 340/15.5 GC; 330/16, 29, 330/75, 86, 98, 99, 100; 328/151, 168; 343/55 M

[56] References Cited
UNITED STATES PATENTS

| | | |
|---|---|---|
| 3,525,948 | 8/1970 | Sherer et al. ................. 330/86 |
| 3,636,463 | 1/1972 | Ongkiehong ................. 330/29 |
| 3,683,367 | 8/1972 | Monroe et al. ............... 330/29 |
| 3,699,325 | 10/1972 | Montgomery, Jr. ......... 340/15.5 GC |
| 3,714,590 | 1/1973 | Freeman ..................... 330/86 |
| 3,786,506 | 1/1974 | Effenger et al. ............. 343/5 R |
| 3,797,014 | 3/1974 | Tompkins .................... 343/5 DP |
| 3,813,609 | 5/1974 | Wilkes et al. ............... 340/15.5 GC |

Primary Examiner—T. H. Tubbesing
Assistant Examiner—H. A. Birmiel

[57] ABSTRACT

An automatic gain control circuit including a wide band digitally controlled amplifier particularly adapted for use with recurring signals. Each of the recurring signals is divided into a large number of discrete time intervals and the gain of the amplifier may be adjusted for each time interval independently of the signal in any other of the time intervals. Transients due to gain modification may be superimposed.

16 Claims, 6 Drawing Figures

AUTOMATIC GAIN CONTROL CIRCUIT AND METHOD

BACKGROUND OF THE INVENTION

The present invention is directed to an automatic gain control circuit and more specifically, to a wide band automatic gain control amplifier for use with recurring signals. In accordance with the invention, each of the recurring signals is divided into a large number of time intervals and the gain of a plural stage amplifier is adjusted for each time interval independently of each of the other time intervals on the basis of the amplitude of previously received signals in the corresponding time interval.

Digitally controlled automatic gain control circuits are well known in the art. These circuits generally comprise a plurality of cascaded amplification stages interposed with attenuation circuits selectively switched into and out of the amplifier circuit. The values of the attenuation circuits are generally weighted in binary fashion to facilitate the control of the gain of the amplifier of a binary gain control word.

These amplifiers find particular utility as seismic amplifiers in which the amplitude of the input signal can be anticipated to grow successively weaker or successively stronger thereby facilitating the use of a clock controlled binary counter to successively increase or decrease the gain of the amplifier. Examples of this type of circuit are the McCarter U.S. Pat. No. 3,308,392 issued March 7, 1967, and the Godinez U.S. Pat. No. 3,376,557 issued Apr. 2, 1968.

Other patents such as the Sherer et al U.S. Pat. No. 3,525,948 issued Aug. 25, 1970, and the Lockheed, Jr. et al U.S. Pat. No. 3,464,022 issued Aug. 26, 1969, disclose the use of such amplifiers as automatic gain control circuits wherein the output signal is compared with predetermined limits and a gain control counter is pulsed up or down responsively thereto to adjust the gain of the amplifier in accordance with the amplitude of the output signal.

Still other patents such as the Neitzel U.S. Pat. No. 3,392,370 issued July 9, 1968, and the Nickels U.S. Pat. No. 3,510,682 issued May 5, 1970, have suggested the use of a digital computer or other circuit to generate a predetermined gain profile of digital signals to control the insertion of the attenuated elements into the various stages of the amplifier.

There are, however, certain situations when the circuits of the above identified patents do not provide the degree of amplification control desired. In the seismic art, for example, there may be large variations in the amplitude of the signals received by the amplifier due, not to the distance from the source, but to discontinuities, etc. In such circumstances, the gain adjustment suitable for one portion of the received signal may be entirely satisfactory for an immediately adjacent portion of the signal received. Where, for example, compressive waves initiated by detonation are successively generated, the method and circuit of the present invention permits adjustment of each of a plurality of small time intervals during which the signal is received to be amplified as a function of the amplitude of the signal from an earlier detonation in only the corresponding time interval rather than on the strength of the entire signal or on the strength of an earlier portion of the same signal.

A second problem associated with the known circuits is that of the transients continually generated as the gain of the various stages of the amplifier are adjusted as the signal is passed through the amplifier. These transient problems are solved in the present invention through the amplifier. These transient problems are solved in the present invention through the superimposition of the transients from each of the cascaded amplifier stages on the same minute portion of the received signal as it passes through the amplifier. By ignoring this small portion of the received signal during each of the time intervals, the amplified signal may be evaluated without distortion due to transients.

The present invention also has particular utility in radar systems in which a return signal from each radar transmitter pulse may be divided into a plurality of time intervals and the gain of the amplifier independently adjusted for each of the time intervals. Sensitivity may thereby be greatly enhanced.

It is accordingly an object of the present invention to provide a novel method and automatic gain control circuit wherein the gain of the circuit is independently adjusted during each of the large number of discrete time intervals independently of the gain of the amplifier during any of the other time intervals in which the signal is received.

Another object of the present invention is to provide a novel method and automatic gain control circuit which has particular utility with recurring signals whereby the gain of the amplifier for different portions of the received signal may be adjusted on the basis of the amplitude in previously received signals during the corresponding time interval.

Another object of the present invention is to provide a novel method and wide band automatic gain control amplifier in which the transients introduced through the switching of attenuation elements into and out of the circuit are superimposed.

A further object of the present invention is to provide a novel method and automatic gain control circuit in which the digital gain control signals are recirculated through a memory circuit to automatically interpose and intersignal delay.

These and other objects and advantages of the present invention will be apparent to one skilled in the art to which the invention pertains from the claims and from a perusal of the following detailed description when read in conjunction with the appended drawings.

THE DRAWINGS

THE DETAILED DESCRIPTION

The present invention may be understood by reference to the drawings as above identified and further discussed in the order set out in the following Table of Contents:

TABLE OF CONTENTS

I. Theory of Operation (FIG. 1)
II. AGC System Description (FIG. 2)
  1. The Integrator (FIG. 2)
  2. Synchronism
  3. WBAGC Amplifier (FIGS. 3-5)
  4. Transient Superimposition (FIG. 6)
III. Advantages and Scope of Invention

I. Theory of Operation

Figure 1:
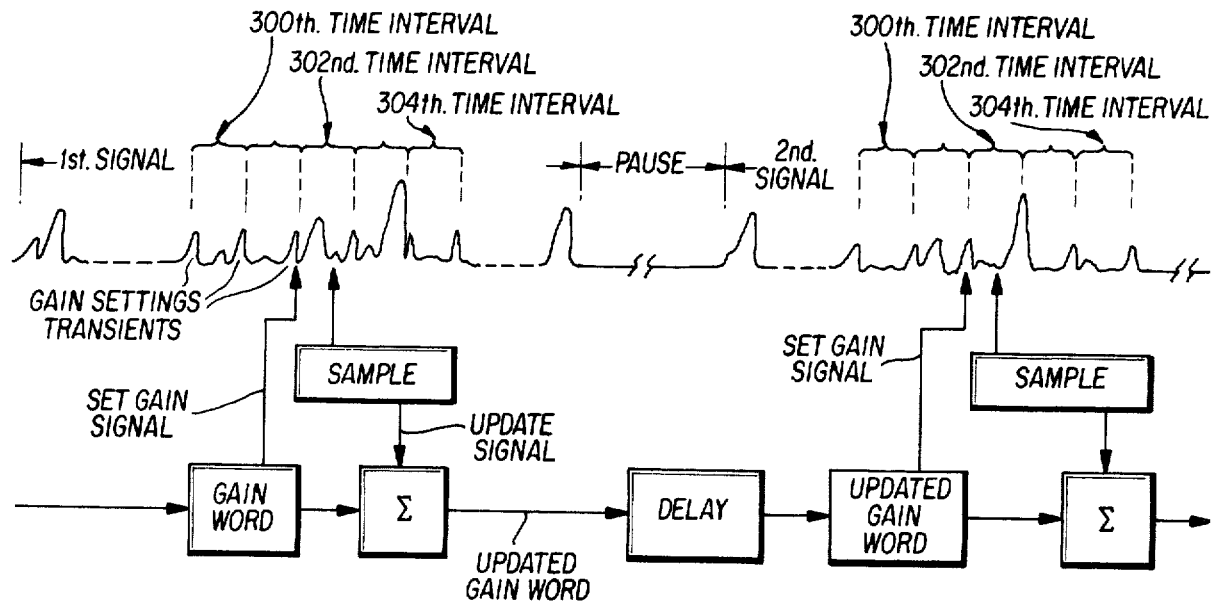
FIG. 1 is a diagrammatic illustration of the operation of the automatic gain control circuit (AGC) of the present invention.

With reference to FIG. 1 where recurring signals Nos. 1 and 2 are illustrated, the time interval between the commencement of signal No. 1 and signal No. 2 may be referred to as the intersignal period and may, for example, correspond to the time interval during which a radar return signal is received from a target at the outer range limit of the radar, for example, 250 miles. After a brief quiescent period following the transmitter pulse, the return signal from each pulse is divided into a plurality of range bins corresponding to the conventional range discrimination networks of the radar by dividing the intersignal period into a plurality of discrete time increments.

In the environment of seismic exploration overland or undersea, the signals may be the detected sound waves received from successive detonations.

As shown in the upper portion of FIG. 1, the discrete time intervals may be defined by the vertical dashed lines with brackets identified as the 300th time interval, 302nd time interval and 304th time interval. The entire signal may contain a large number of time intervals starting with No. 1 continuing to several dozen or to a hundred or more. The time interval is preferably less than 1 microsecond and in the illustrated embodiment is 0.4 microseconds.

In accordance with one aspect of the present invention, the amplification of the signal is adjusted in accordance with the amplitude of the signal to be amplified. Thus, the gain of the amplifier may be desirably lower for signals at close range than for the signals at a greater range since the strength of the signals at close range is normally greater in, for example, seismic exploration. Also, where the ambient or noise level is low, the gain of the amplifier may be increased.

In the illustrated embodiment, arrangements are provided to generate a unique digital gain control word for each time interval. The gain control word is stored for the intersignal period and used for adjusting the gain of the amplifier as subsequent signals are received. The gain control word for a particular time interval, e.g., the 302nd time interval, may be determined by detecting the signals amplitude in the 302nd time interval of a preceding signal to provide an update word, then combining the update word with the then existing gain control word to update that word, and storing for the intersignal period for use during the 302nd time interval of a subsequent signal. A separate gain control word is thus available for each time interval.

With continued reference to FIG. 1 and to signal No. 1, the gain control word controlling the gain of the amplifier during the time interval in which the signal in the 302nd time interval is received is applied to the gain adjusting circuit of the present invention at the beginning of the corresponding time interval, and the amplifier gain is not adjusted again during the duration of that time interval. The gain may, however, be adjusted again at the beginning of the 303rd time interval, and in the illustrated embodiment a separate gain control word is provided for each time interval.

The amplitude of the signal at the output terminal of the amplifier may be sampled during the latter part of each time interval after the gain adjusting transients have subsided. This sample may be utilized as the update signal to adjust the value of the digital gain control word for that same time interval during the reception of the next signal. The corrected or updated gain control word may then be stored for a time period equal to the intersignal period, and then may be again utilized to adjust the gain of the amplifier at a time coinciding with the beginning of the time interval, here assumed to be the 302nd time interval, of the second signal. The second signal in the 302nd time interval may be again sampled after the gain adjustment transients have subsided and an updating signal combined with the gain control word for the 302nd time interval then in storage to produce a new updated digital gain control word for the amplifier in amplifying the 302nd time interval of the third signal (not shown).

The same procedure may be followed for each of the time intervals. This time interval-by-time interval adjustment of amplifier gain is accomplished for each time interval of the signal independently of the value of the gain word or of the adjustment in gain of the amplifier in any of the other time intervals.

II. AGC System Description

The AGC system described above in connection with FIG. 1 may take the form illustrated in FIGS. 2-6.

Figure 2:
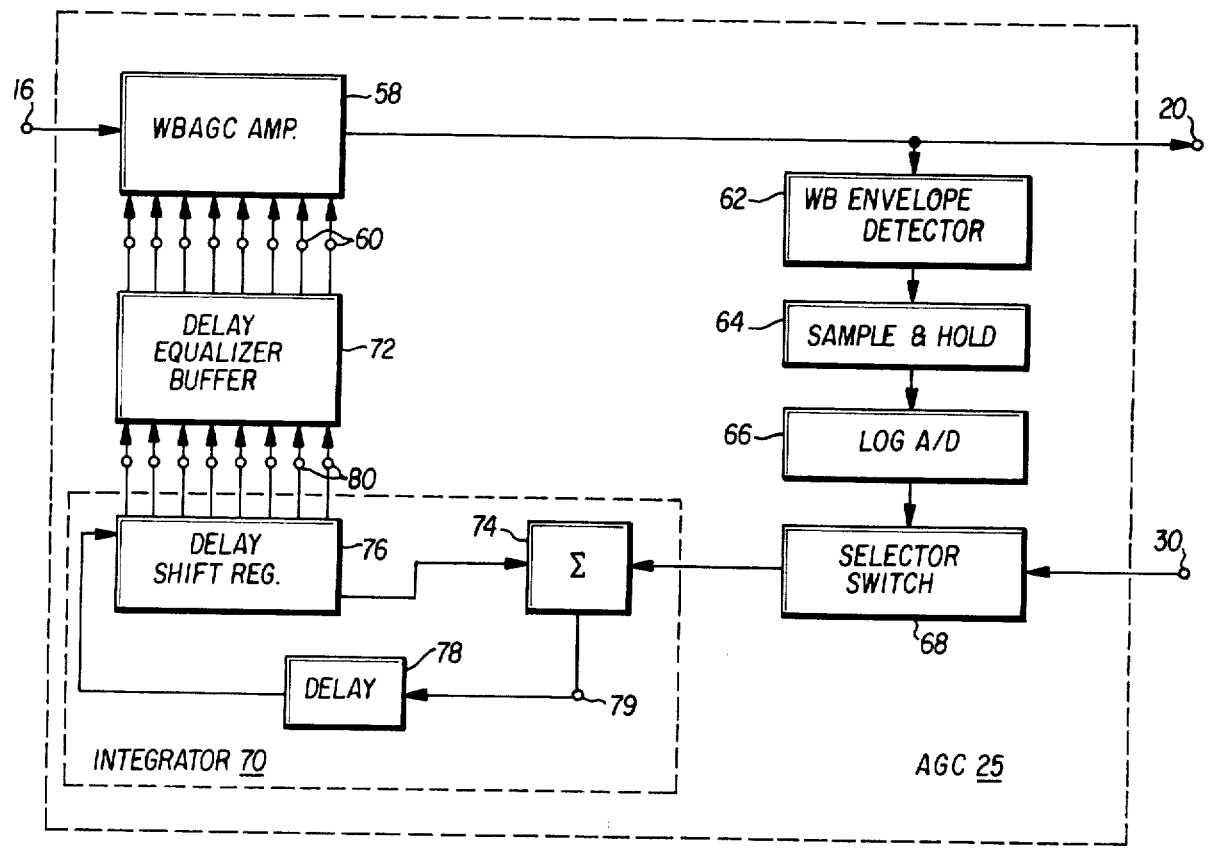
FIG. 2 is a block diagram of the AGC circuit of the present invention.

With reference to FIG. 2, the AGC circuit 25 includes a wide band automatic gain control amplifier (WBAGC amp) 58 having an input terminal 16 and an output terminal 20. The gain of the WBAGC amp 58 is determined by a binary control signal which is applied by way of the control terminals 60 to the various stages of the WBAGC amp 58.

As earlier stated, the basic function of the AGC circuit 25 may be to adjust the amplitude of the signal relative to the dynamic range of a signal processor (not shown) so that maximum sensitivity of the processor can be utilized and saturation avoided. Wide variations in signal amplitude in the same time interval for successive signals can be accommodated by controlling the gain of the WBAGC amp 58 on a time-interval-by-time interval basis. Broadly, this may be accomplished by adjusting the level of amplitude of the presently received signal in the WBAGC amp 58 in accordance with information which has been accumulated in an integrator 70 for previous signals earlier received in the same time interval.

More specifically, te amplitude of the input signal may be adjusted by the WBAGC amp 58 which, as will hereinafter be described in greater detail, comprises eight cascaded stages. The gain of each stage is individually controlled by the eight bin digital gain control signal applied to the terminals 60 from the integrator 70.

Information as to the amplitude of the signal at the output terminal of the WBAGC amp 58 may be applied to the integrator 70 by a circuit which includes a conventional wide band envelope detector 62. The detector 62 detects the envelope of the output signal from the WBAGC amp 58 and is in turn connected to a conventional sample-and-hold circuit 64. The sampled amplitude of the amplified signal, i.e., the analog output signal from the sample-and-hold circuit 64, may be converted into a digital signal in a conventional logarithmic analog-to-digital converter 66 and the digital signal related to the sampled amplitude is fed through a selector switch 68 to the integrator 70.

A feedback signal from the signal processor (not shown) from a terminal 30 may be also applied to the selector switch 68 for overriding the digital input signal when desired to prevent exceeding the minimum and maximum levels of the signal processor. However, a feedback signal from the signal processor from the terminal 30 may not be necessary in a properly operating system.

In the preferred embodiment of the present invention, the amplitude of an incoming signal is not used to prospectively adjust the gain of WBAGC amp 58. The sampling of the amplitude of the signal prior to the amplification thereof and the adjustment of each gain control word before the signal is applied to the WBAGC amp 58 is also possible to accord with the present invention. However, such an arrangement would require a delay of the signal to be interposed between the sampling point and the WBAGC amp 58. In the illustrated embodiment, the gain control word that is used for a particular time interval of an incoming signal is that which is based on the sampled amplitudes in the same time interval of earlier signals and which has been stored in the integrator 70 for an intersignal period or multiples thereof. To update the information stored in the integrator 70 to determine the gain control signal for adjustment of the amplitude of the signal in the same time interval from the next signal, the envelope of the output signal of the WBAGC amp 58 is detected for each time interval by the wide band envelope detector 62 and sampled by the sample-and-hold circuit 64.

The sample-and-hold circuit 64 may be selectively gated, as is well known in the art, to avoid the transients added to the signal by the discrete gain adjustment of the WBAGC amp 58 so that the output signal of the sample-and-hold circuit 64 is representative of the amplitude of the output signal in a particular time interval. This amplitude signal is converted to a digital signal in the logarithmic analog-to-digital converter 66 and supplied to the selector switch 68. The analog-to-digital converter 66 is operative to convert the analog input signal to a four bit binary digital logarithmic representation (db) once every 0.4 microseconds, and to thereafter hold the digital signal for a period of 0.25 microseconds duration. The four bit binary digital output signal may be weighted on a bit-by-bit basis, in increments of 3/16 db, for example.

With continued reference to FIG. 2, the four bit digital signal from the logarithmic analog-to-digital converter 66 is fed to the selector switch 68 which optionally may also receive the limit control signal from terminal 30 as described above. In the absence of a signal from the terminal 30, the digital signal from the logarithmic analog-to-digital converter 66 is fed to the integrator 70 through the selector switch 68 and provides a digital gain control word on terminals 80 which control the WBAGC amp 58. In the illustrated system, WBAGC amp 58 may be a 30 MHz. I. F. amplifier, with a gain that is controlled digitally over a 48 db range in 3/16 db steps. A new gain control word is applied once each 0.4 microseconds at a point in time which corresponds to each time interval. This range of gain control is provided by an 8-bit binary signal which circulates in the integrator 70.

1. The Integrator.

With continued reference to FIG. 2 and as discussed above, the integrator 70 stores, on a time interval-by-time interval basis, the updated information relating to the amplitude of previous signals for controlling the gain adjustment of the WBAGC amp 58. The integrator 70 comprises a loop adder 74, a delay circuit 78 and a delay shift register 76. The 4-bit digital signal from the logarithmic analog-to-digital converter 66 is normally fed through the selector switch 68 to the loop adder 74 where it is added with the 8-bit digital gain control signal that was present in the delay shift register 76 controlling the gain of the WBAGC amp 58 at the time the sampled signal was passing through.

Thus, if the amplitude of the signal detected and sampled by the sample-and-hold circuit 64 is less than a predetermined level, the 4-bit correction signal applied to the loop adder 74 will be such as to modify the 8-bit gain control word to increase the gain of the WBAGC amp 58 for the next signal during that particular time interval. Where the sampled amplitude of the signal is above this predetermined level, the 4-bit correction signal will serve to modify the 8-bit gain control word circulating in the integrator 70 to reduce the gain of the WBAGC amp 58 for that time interval in amplifying the next signal. If the sampled amplitude is at the predetermined level, the 4-bit correction signal will not change the gain control signal.

Integrator 70, as illustrated, includes a loop adder 74 which receives the 4-bit digital output signal from the selector switch 68. The adder 74 is connected to receive also the 8-bit digital signal from the delay shift register 76. This 8-bit digital signal constituting the gain control word for each range bin established for the system is shifted through the register 76 at 0.4 microsecond intervals to correspond with the time interval. After updating in loop adder 74, the gain control word is applied to the delay circuit 78 where it is delayed for the intersignal period.

In practice, the integrator circuit 70 may constitute a number of identical 8-bit shift registers equal to the number of 0.4 microsecond periods in an intersignal period. The delay shift register 76 and the loop adder 74 may be in essence two of these registers. The 8-bit gain control words may be circulated with the 8 bits either in series or in parallel. The gain control word may be modified only during the period when it is present in the loop adder 74.

The integrator 70 thus functions as a recirculating memory containing one gain control word for each time interval of the system. The 8 bits of the gain control word at the output terminals 80 of the delay shift register 76 are fed in parallel through the delay equalizer buffer 72 (see FIG. 6) to the eight-stage WBAGC amp 58 and together represent the gain adjustment desired for that particular time interval. The digital value of any particular gain control word is based on data accumulated from the amplitude of previous signals for the same time interval.

The digital word from the A/D converter 66 is representative of the sampled signal and is added to the 8-bit gain control word circulating in the integrator 70. This correction signal contains only the 4 least significant bits. Gross changes in the gain control word which may occur in response to voise and or other spurious signals may thus be prevented.

Upon start up, a short period of operation is required before the gain control words circulating an integrator 70 become appropriately adjusted. In the circuit described below, where the input signal to one time interval was attenuated by 12 db, approximately five signals were required before the gain of the WBAGC amp 58 for that time interval was increased sufficiently to produce an output signal at the same level as before the attenuation was inserted. Similarly, when the attenuation was removed, above five signals were required before the output signal was reduced to the desired level.

The integrator 70 is thus a discrete word output device having a digital output signal. The integrator thus performs the time based integration or signal averaging on a time interval-by-time interval basis for individual time interval control of the gain of the WBAGC amp 58.

2. Synchronism.

Synchronism may be accomplished in any suitable manner. In the illustrated embodiment where the delay circuit 78 constitutes a plurality of registers equal to the number of 0.4 microsecond periods in the intersignal period, the gain control word is advanced one register each time the sample-and-hold circuit 64 operates in a manner well known to those skilled in this art. The sample-and-hold circuit may be operated by a high frequency clock synchronized in any conventional manner to the receipt of a signal on the input terminal 16. The receipt of an input signal need not be periodic. In the interest of clarity and because of the conventionality of such timing circuits, the illustration thereof in the drawings has been omitted and no further description is believed necessary.

3. WBAGC Amplifier.

As previously mentioned, the preferred embodiment of the WBAGC amplifier 58 comprises eight cascaded stages. The attenuation from maximum amplification of the signal that is available by individual binary adjustment of each of the eight stages is set out in the following table:

| Stage | Attenuation |
|---|---|
| 1 | 24.0 db |
| 2 | 12.0 db |
| 3 | 6.0 db |
| 4 | 3.0 db |
| 5 | 1.5 db |
| 6 | 0.75 db |
| 7 | 0.375 db |
| 8 | 0.1875 db |

Figure 3:
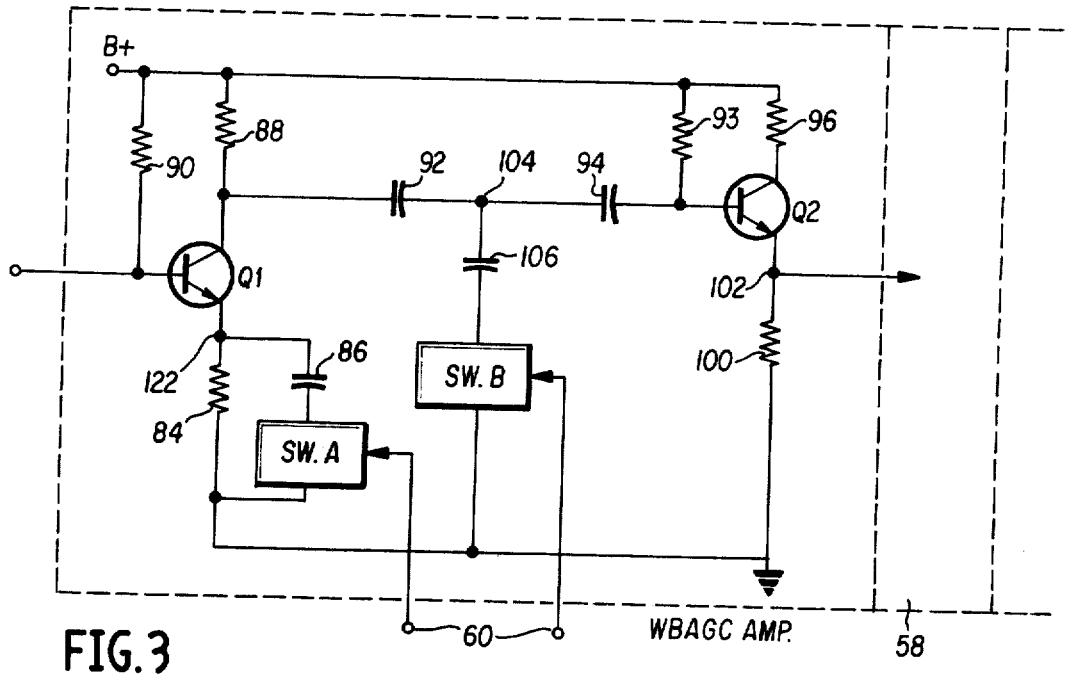
FIG. 3 is a schematic diagram of one amplifying stage of the wide band automatic gain control amplifier of FIG. 2.

The WBAGC amplifier 58 thus provides 48 db amplitude control in 3/16th db increments. The attenuation in each stage of the WBAGC amplifier 58 is achieved by the selective enabling of a capacitive attenuator. A more detailed understanding of the operation of the WBAGC amplifier 58 may be obtained through reference to FIG. 3 wherein the schematic diagram of a circuit adaptable for each of the eight stages is illustrated. With reference now to FIG. 3, the signal applied to the WBAGC amplifier 58 is applied to the base electrode of an NPN transistor Q1 whose emitter electrode is grounded through a resistor 84. The resistor 84 is shunted by a capacitor 86 in series with a switch A, the operation of which will hereinafter be described in more detail in connection with FIG. 5.

The collector and base electrodes of the transistor Q1 are connected respectively to an appropriate source of bias potential through resistors 88 and 90. The output signal of the transistor Q1 is taken from the collector electrode and is passed through a pair of capacitors 92 and 94 to the base electrode of a second NPN transistor Q2. The collector and base electrodes of the transistor Q1 are appropriately biased through resistors 96 and 98, and the emitter electrode thereof grounded through a resistor 100. The output signal of the stage is taken across the resistor 100 from the terminal 102 at the emitter electrode. The interconnection 104 of the two capacitors 92 and 94 is grounded through a capacitor 106 in series with a switch B, the operation of which will hereinafter be more fully described in connection with FIG. 3.

Figure 5:
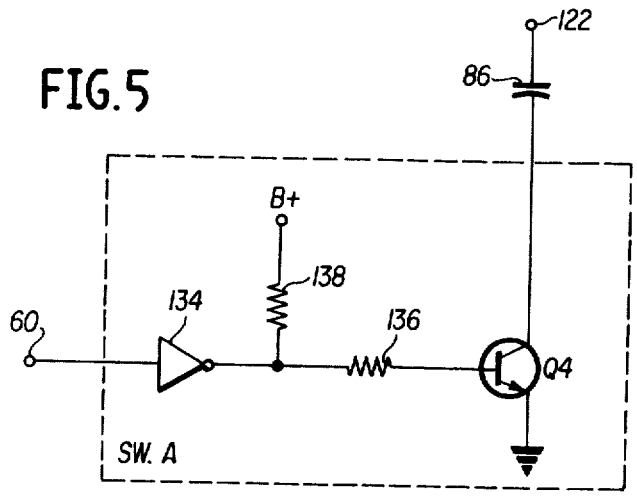
FIG. 5 is a schematic circuit diagram of switch A of the circuit of FIG. 3; and, FIG. 6 is a schematic drawing of the delay equalizer buffer of the circuit of FIG. 2.

Both switch A and switch B are controlled by the selective application of one or more bits of the 8-bit gain control word to the appropriate control terminal 60 from the delay equalizer buffer 72, as will be more fully desscribed in connection with FIG. 5.

Switch B of the circuit of FIG. 3 is utilized for the switching of the major attenuation element, i.e., capacitor 106, into and out of the various stages of the WBAGC amp 58. The optical inclusion of switch A allows the exercise of a finer control by the selective introduction of a smaller attenuator, i.e., capacitor 86, to the collector-emitter circuit of the transistor Q1.

It has been found that the utilization of a conventional transistor or diode switching circuit for switch B is unsatisfactory by reason of excessive recovery time. The preferred embodiment thus utilizes a switch of the type illustrated in FIG. 4 wherein the appropriate bit of the digital gain control word is applied through a pair of inverters 110 and 112 and thereafter through a resistor 114 and a capacitor 116 connected in parallel to the base electrode of an NPN transistor Q3. The collector electrode of the transistor Q3 is coupled to the base electrode thereof by way of resistors 118 and 120, and is coupled to the terminal 104 in the circuit of FIG. 3 by way of the capacitor 106. The emitter electrode of the transistor Q3 is grounded and the collector-to-emitter path thereof is paralleled by a diode 124. Biasing resistors 126 and 128 and an isolating capacitor 132 are provided. While the theory of operation of the circuit of FIG. 4 is not completely understood, the recovery time of the switching circuit with the addition of the diode 124 has been found far superior to other switching circuits considered.

Figure 4:
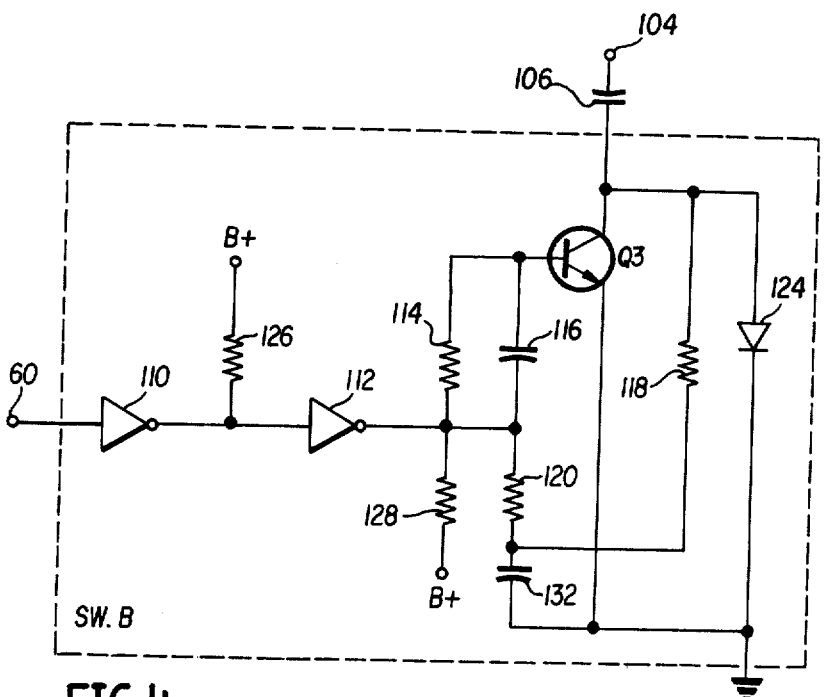
FIG. 4 is a schematic circuit diagram of switch B of FIG. 3.

Typical values for the various circuit components of FIG. 4 are as follows:

| | |
|---|---|
| inverters 110 and 112 | SN 7401 N |
| diode 124 | HP 2301 |
| transistor Q3 | 3646 |
| resistors 120 and 126 | 1.2 K ohms |
| resistors 114 | 5.6 K ohms |
| resistors 118 | 2.2 K ohms |
| capacitor 132 | 2 picofarads |
| capacitor 106 | 3 picofarads |

The switch A shown in FIG. 3 is illustrated in greater detail in FIG. 5. Referring now to FIG. 5, an appropriate bit of the digital gain control word is applied through an inverter 134 and a resistor 136 to the base electrode of a NPN transistor Q4. The emitter electrode of the transistor Q4 is grounded and the collector electrode thereof is coupled to the terminal 122 in FIG. 3 at the emitter electrode of the transistor Q1 by way of the capacitor 86. The base electrode of the transistor Q4 is connected to an appropriate source of bias potential through a resistor 128.

Typical values for the various circuit components of the circuit of FIG. 5 are as follows:

| inverter 134 | SN 7401 N |
|---|---|
| transistor Q4 | 3646 |
| resistor 136 | 6.6 K ohms |
| resistor 138 | 1.2 K ohms |

With reference again to FIG. 2, the signals applied to the input terminals 60 of the WBAGC amp 58 are derived in parallel from the conventional delay shift register 76 of the integrator 70, but are delayed in the delay equalizer buffer 72 so that the transients associated with the switching of the attenuation into and out of the various stages of the amplifier 58 will be superimposed on the transients associated with the switching in the preceding stages of the amplifier 58 as the signal passes through the eight stages thereof.

4. Transient Superimposition.

Figure 6:
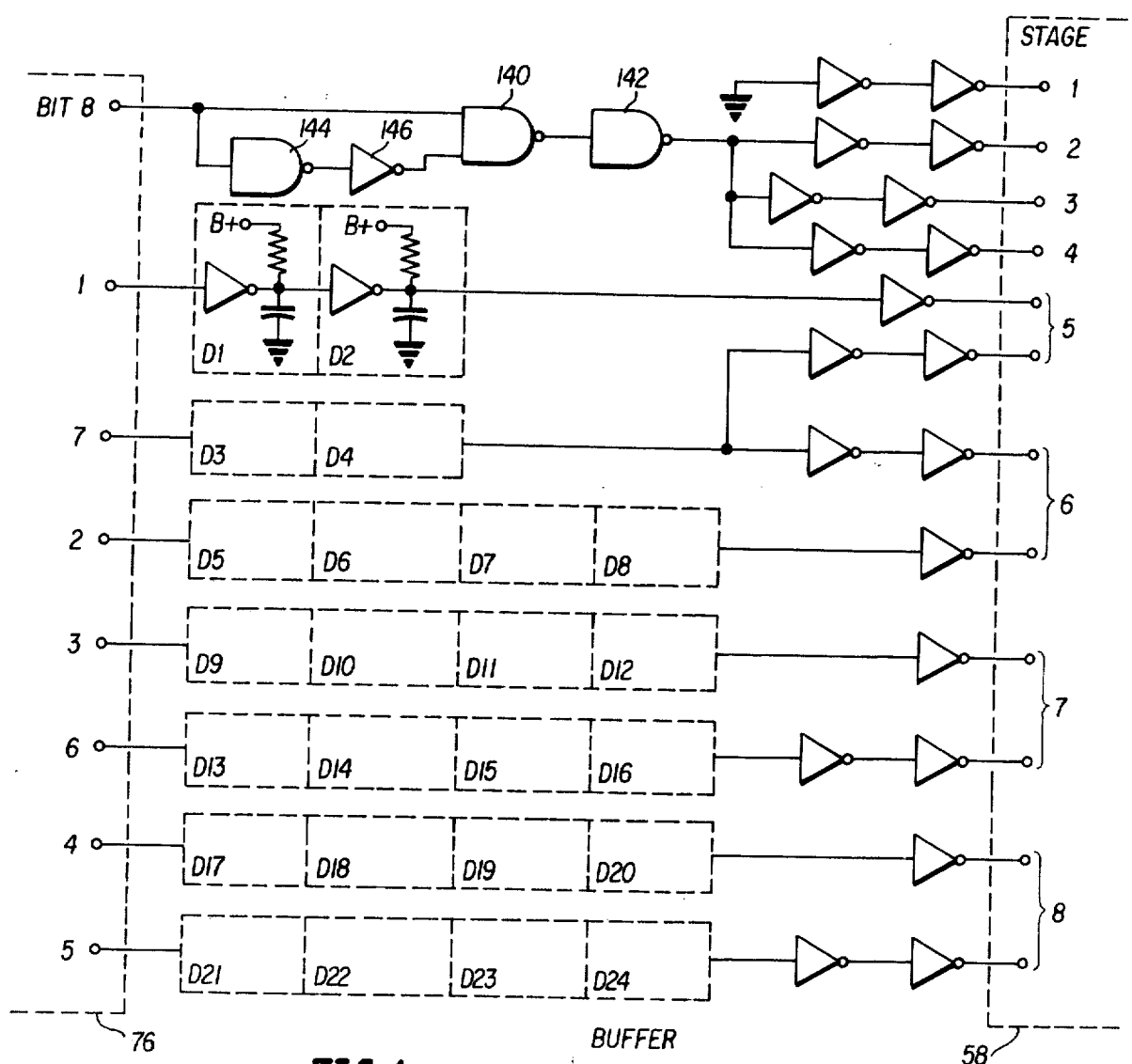

With reference to FIG. 6, the switching of the attenuation into and out of the amplifier stage results in the unavoidable generation of transients. The frequency response of the WBAGC amp 58 is necessarily wide band and hence the switching transients are passed. By providing the delay equalizer buffer 72 with separate signal channels having different delays, all of the switching transients may be confied to the same approximately 0.1 microseconds portion of a 0.4 microsecond range bin. The delay equalizer buffer 72 introduces successive delays in terms of nanoseconds into the application of successive bits of the 8-bit digital gain control word to the cascaded stages of the WBAGC amp 58 so that the transient generated in each stage will be superimposed on the transients generated in the preceding stages as the signal passes through the WBAGC amp 58.

V. ADVANTAGES AND SCOPE OF INVENTION

The automatic gain control method and apparatus of the present invention as above described dynamically adjusts the amplification of recurring signals on a time interval-by-time interval basis. By dividing each of the signals into a very large number of small time intervals, and by control of the amplification of the signal in each of the time intervals only on the basis of the sampled amplitude of earlier signals in the same time interval, a degree of amplitude control heretofore unknown has been achieved permitting far greater sensitivity of downstream signal processing circuits. The effects of spurious signals, e.g., noise, are limited, but the system rapidly responds to a large change in the signal in a particular time interval.

By use of a digital gain control signal, the storage of the gain control word provides information readily usable for cancelling spurious signals. Also, this provides an almost instantaneous dynamic range control in addition to the dynamic range of the amplifier. With 1280 time intervals, the digital integrator loop operates with 1280 8-bit numbers to provide the desired independent AGC action on each separate time interval.

The digital control of the amplifier by the application of various bits of the gain control signal to various stages of the amplifier permits a very fine control of amplifier gain as well as superimposition of the gain modification transients on a small portion of each time interval that processing of the signal may be restricted to the larger portion thereof and thus enhanced.

The same concepts may be used for extending and controlling a communication receiver dynamic range while matching "dynamic range" interfaces with the signal processor downstream.

The present invention may thus be embodied in other specific forms without departing from the spirit or essential characteristics thereof. The presently disclosed embodiments are, therefore, to be considered in all respects as illustrative and not restrictive, the scope of the invention being indicated by the appended claims rather than by the foregoing description, and all changes which come within the meaning and range of equivalency of the claims are, therefore, intended to be embraced therein.

What is claimed is:

1. An amplifier comprising:
   a plurality of amplification stages connected in cascade, each of said amplification stages having a predetermined gain and means for reducing said predetermined gain by a predetermined amount in response to the application of at least one bit of a plural bit digital gain control signal;
   means for generating a plural bit binary gain control signal representative of a selected degree of amplification; and,
   means for applying different ones of the bits of said plural bit binary gain control signal to said gain reducing means to independently control in discrete levels the gain of each of said amplification stages, said bit applying means including means for delaying the bits of said gain control signal by increments of time corresponding to the increments of time required for an analog signal to pass through the cascaded amplification stages preceding the stage to which each of the bits of the gain control signal is applied, whereby transients generated by the discrete adjustments in the gain of each of said amplification stages are superimposed on the same portion of the analog signal.

2. The amplifier of claim 1 wherein said gain reducing means comprises a capacitor and switch means responsive to at least one bit of said digital gain control signal, said switch means including a transistor and a diode connected in parallel.

3. A method of selectively varying the amplification of an analog signal comprising the steps of:
   a. providing an amplifier having plural cascaded stages, each of said cascaded stages being variable in gain by a discrete amount;
   b. generating a plural bit; binary gain control signal representative of a selected amplification;
   c. delaying different bits of the binary gain control signal by different amounts;
   d. applying different ones of the delayed bits of the binary gain control signal to different ones of the cascaded stages to vary the gain thereof in discrete amounts; and,
   e. passing the analog signal through the cascaded stages of the amplifier.

4. The method of claim 3 wherein all of the bits applied to each stage of the amplifier are delayed for a time interval substantially equal to the delay of the analog signal resulting from the passage of the analog signal through the preceding stages of the amplifier, whereby transients generated by the discrete variation in the gain of each of the stages is superimposed on the same portion of the analog signal.

5. A method of adjusting the gain of a plural stage amplifier comprising the steps of:
   a. providing a plural stage amplifier;
   b. generating a plural bit digital signal representative of the desired gain of the amplifier;
   c. selectively delaying the bits of the digital signal for a time sufficient to superimpose gain adjustment transients on the same portion of the signal being amplified as the signal being amplified passes through the stages of the amplifier; and,
   d. selectively varying the gain of different stages of the amplifier in response to different bits of the digital signal.

6. An automatic gain control circuit comprising:
   means including means for generating a plural bit binary gain control signal including an amplifier for receiving a variable amplitude signal of recurring nature;
   means for sampling the amplitude of the signal in one occurrence thereof at a pluarlity of temporally spaced time intervals; and,
   means for varying the gain of said amplifier for a subsequent occurrence of the signal in each of said plurality of temporally spaced time intervals in response to the sampled amplitude in the corresponding time intervals of the sampled occurrence of said signal, said amplifier including a plurality of amplification stages connected in cascade, each of said amplification stages having a predetermined gain and means for reducing said predetermined gain by a predetermined amount in response to the application of at least one bit of a plural bit digital gain control signal.

7. The automatic gain control circuit of claim 6 wherein the gain of the amplifier in each of said plurality of time intervals in said subsequent occurrence of the signal is varied in accordance with the sampled amplitude in the corresponding one of said plurality of time intervals of a plurality of the immediately preceding signals.

8. An amplification system comprising:
   a plural stage variable gain amplifier having an input terminal and an output terminal;
   means for periodically sampling the signal at said output terminal;
   means for converting said amplitude samples to digital update signals;
   circulating memory means for circulating a plurality of digital gain control signals;
   means for modifying said circulating control signals responsively to said update signals; and,
   means for modifying the gain of said amplifier responsively to said modified circulating control signals.

9. The amplification system of claim 8 wherein said digital control signals are plural bit signals, and wherein each stage of said amplifier is responsive to different ones of said bits.

10. The amplification system of claim 9 wherein said gain modifying means includes means for delaying all of the bits applied to each stage of the amplifier for a time interval substantially equal to the delay of a signal resulting from the passage of an analog signal through the preceding stages of the amplifier, whereby transients generated by the discrete variation in the gain of each of the stages is superimposed on the same portion of the analog signal.

11. An automatic gain control circuit comprising:
   means including an amplifier for receiving a variable amplitude signal of recurring nature;
   means for sampling the amplitude of the signal in one occurrence thereof at a plurality of temporally spaced time intervals; and,
   means for varying the gain of said amplifier for a subsequent occurrence of the signal in each of said plurality of temporally spaced time intervals in response to the sampled amplitude in the corresponding time intervals of the sampled occurrence of said signal,
   said amplifier comprising a plurality of stages, each stage including a pair of transistors and an attenuating element,
   said attenuating element including a capacitor and switch means for operably inserting said capacitor into the circuit of the stage;
   said switch means including a third transistor and a diode connected across the emitter-collector path of said third transistor.

12. The amplifier of claim 11 including a second attenuating element in the emitter-collector circuit of one of said pair of transistors and means for selectively connecting said second attenuating element into the circuit of said stage.

13. An amplifier comprising:
   a plurality of amplification stages connected in cascade, each of said amplification stages having a predetermined gain and means for reducing said predetermined gain by a predetermined amount in response to the application of at least one bit of a plural bit digital gain control signals;
   means for generating a plural bit binary gain control signal representative of a selected degree of amplification; and,
   means for applying different ones of the bits of said plural bit binary gain control signal to said gain reducing means to independently control in discrete levels the gain of each of said amplification stages, said bit applying means including means for delaying the bits of said gain control signal and means for applying different ones of the delayed bits of the binary gain control signal to different ones of the cascaded stages to vary the gain thereof in discrete amounts.

14. The amplifier of claim 13 wherein said amplifier is an analog amplifier.

15. The amplifier of claim 1 wherein said amplifier is an analog amplifier.

16. The automatic gain control circuit of claim 6 wherein said variable amplitude signal is an analog signal.

* * * * *